United States Patent
Gris

(10) Patent No.: US 6,607,961 B1
(45) Date of Patent: Aug. 19, 2003

(54) METHOD OF DEFINITION OF TWO SELF-ALIGNED AREAS AT THE UPPER SURFACE OF A SUBSTRATE

(75) Inventor: Yvon Gris, Tullins (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/696,121

(22) Filed: Oct. 25, 2000

(30) Foreign Application Priority Data

Oct. 25, 1999 (FR) .............................. 99 13543

(51) Int. Cl.7 ............................................ H01L 21/331
(52) U.S. Cl. ........................ 438/365; 438/320; 438/366
(58) Field of Search ................... 438/254, 320, 438/364, 365, 366

(56) References Cited

U.S. PATENT DOCUMENTS

| | | | |
|---|---|---|---|
| 5,137,842 A | * 8/1992 | Chan et al. | 438/254 |
| 5,365,090 A | * 11/1994 | Taka et al. | 257/197 |
| 5,439,832 A | 8/1995 | Nakamura | 437/31 |
| 5,523,245 A | 6/1996 | Imai | |

FOREIGN PATENT DOCUMENTS

EP 0 295 709 A2 12/1988

OTHER PUBLICATIONS

French Search Report from French Patent Application 99 13543, filed Oct. 25, 1999.

* cited by examiner

Primary Examiner—John F. Niebling
Assistant Examiner—Christopher Lattin
(74) Attorney, Agent, or Firm—Wolf, Greenfield & Sacks, P.C.; James H Morris; Gary S. Engelson

(57) ABSTRACT

A method for defining, on the upper surface of a substrate, two self-aligned areas, including the steps of depositing a protective layer; depositing a covering layer; opening the protective and covering layers at a location substantially corresponding to the desired border of the two areas; forming a spacer along the side of the opening, this spacer having a rear portion against said border and an opposite front portion; opening the protective and covering layers behind the rear portion of the spacer; and removing the protection layer to reach the rear portion of the spacer; whereby two self-aligned areas are defined on either side of the spacer length.

6 Claims, 4 Drawing Sheets

METHOD OF DEFINITION OF TWO SELF-ALIGNED AREAS AT THE UPPER SURFACE OF A SUBSTRATE

BACKGROUND OF THE INVENTION

1. Field of the Invention

The present invention relates to a method for defining two self-aligned areas at the upper surface of a substrate.

The present invention more specifically applies to the manufacturing of semiconductor components, and especially of integrated circuits.

2. Discussion of the Related Art

During manufacturing of integrated circuits, it is usual to perform many photoetching steps to define successive areas and layers on a semiconductor substrate. However, it is well known that areas defined by two distinct photolithographic steps (two distinct masks) cannot be ideally aligned due to the inevitable alignment tolerance between two successive masks.

Various self-alignment methods have thus been developed to obtain areas defined on the upper surface of a substrate and separated by precise distances.

A general example of a self-alignment technique using spacers is illustrated in FIG. 1. An active area delimited by an insulating region 2 is defined on a substrate 1. In the case of semiconductor substrates, region 2 typically is a thick oxide region, for example a layer formed by the LOCOS method, or, as in the example shown, an oxide formed in a trench made in the substrate. Then, a layer 3 that is opened in a region 4 located above a portion of the active area is deposited. After this, a spacer 5 is conventionally formed at the border of the opened region. A first area A1 arranged on the front side of the spacer and a second area A2 arranged on the rear side of the spacer are thus defined. The distance between these areas does not depend on the successive positioning of two masks but only on the spacer length, that is, on the thickness of layer 3 and on the formation mode of the spacer. In the case where substrate 1 is a semiconductor, area A1 will, for example, undergo a dopant implantation and area A2 will, for example, be modified by a dopant contained under the lower portion of layer 3, which will also, or instead of this, be a contacting layer.

A known example of application of this conventional method to the forming of the base-emitter region of an NPN transistor is illustrated in FIGS. 2A and 2B.

As illustrated in FIG. 2A, an active area of a substrate 1 is delimited by a thick oxide trench 2. On this structure are successively formed a P-type doped polysilicon layer 11 and a silicon oxide layer 12. A central opening 4 is etched. A thermal oxidation step enables forming a thin oxide layer 13 on all the exposed silicon surfaces. A P-type dopant is then implanted to form intrinsic base 15 of the NPN transistor. During the anneal of this implantation, the P-type dopant contained in layer 11 starts diffusing into the substrate to form an extrinsic base region 16.

At the next steps, as illustrated in FIG. 2B, a spacer is formed, for example by successively depositing a thin silicon-nitride layer 17 and a polysilicon or silicon oxide layer 18 and by anisotropically etching layer 18, and then selectively etching layer 17 that is then masked by layer 18. Finally, an N-type doped polysilicon layer 19 is deposited, which is used as a source for the forming of a shallow N-type emitter region 20 in P-type base region 15.

Thus, the lateral distance between emitter 20 and extrinsic base 16 is defined by length d of the spacer and by the features of the manufacturing method.

The alignment method described hereabove is totally satisfactory but it should be noted that there are many circumstances under which it cannot be applied. For example, the method cannot be used if the material of layer 3 (P-type doped polysilicon 11 in the specific case of FIG. 2A) disturbs upon its deposition the substrate in area A1. A problem is also raised if, during the etching of layer 3, there is a risk of alteration of the properties of area A1. This last problem is for example raised if the upper surface of the substrate is covered with a thin active layer, for example, SiGe, and if layer 3 is polysilicon; the polysilicon etching will generate a strong risk of overetching of SiGe.

SUMMARY OF THE INVENTION

Thus, the present invention provides a novel method of formation of two self-aligned areas on a semiconductor substrate.

The present invention provides such a method that is especially applicable to the case where the localized areas are defined on an epitaxial silicon-germanium layer.

Another object of the present invention is to form an NPN transistor structure with a silicon-germanium base.

To achieve these and other objects, the present invention provides a method for defining, on the upper surface of a substrate, two self-aligned areas, including the steps of:

depositing a protective layer;

depositing a covering layer;

opening the protective and covering layers at a location substantially corresponding to the desired border of the two areas;

forming a spacer along the edge of the opening, this spacer having a rear portion against said border and an opposite front portion;

opening the protective and covering layers behind the rear portion of the spacer; and removing the protection layer to reach the rear portion of the spacer;

whereby two self-aligned areas are defined on either side of the spacer length.

According to an embodiment of the present invention, the method includes the step of inserting a material in the space between the substrate and the covering layer.

According to an embodiment of the present invention, said material is adapted to diffusing into the substrate under the remaining portion of the covering layer.

According to an embodiment of the present invention, the substrate is a semiconductor substrate of a first conductivity type coated with a layer of the opposite conductivity type at a low doping level, the protective layer is made of silicon oxide, and the covering layer is formed of the superposition of a doped polysilicon layer of the second conductivity type and of a silicon nitride layer.

According to an embodiment of the present invention, after the step of removing the protective layer, it is provided to uniformly deposit a conductive layer, for example a polysilicon layer, by chemical vapor deposition.

According to an embodiment of the present invention, the layer of the opposite conductivity type at a low doping level is a silicon-germanium epitaxial layer.

The foregoing objects, features and advantages of the present invention, will be discussed in detail in the following non-limiting description of specific embodiments in connection with the accompanying drawings.

DETAILED DESCRIPTION

FIGS. 3A to 3D are simplified cross-section views generally illustrating essential steps of a method according to the present invention.

A substrate 1, formed of an N-type single-crystal silicon wafer 21 on which is formed a P-type silicon-germanium epitaxial layer 22, is considered as an example. Although this specific example is considered herein, the present invention may be used with any type of substrate. It should indeed be noted that the steps illustrated in FIGS. 3A to 3D do not depend on the nature of the substrate. However, generally, the case where the substrate would risk being damaged by the deposition or the etching of a first active layer deposited thereon, such as a heavily-doped polysilicon layer will be considered.

Figure 3:
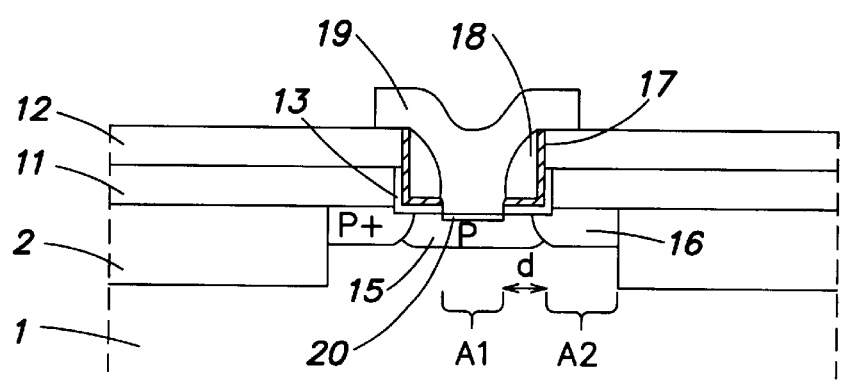
FIGS. 3A to 3D are cross-section views illustrating steps of definition of two self-aligned areas according to the present invention.
Figure 3A:

Thus, according to the present invention, as shown in FIG. 3A, it is provided in a first step to form on the substrate a protective layer 23, which can be deposited on the upper surface of substrate 1 in conditions adapted to not damage the substrate in volume or surface. Protective layer 23 will for example be an $SiO_2$ layer deposited by chemical vapor deposition. As will be seen hereafter, this layer is a sacrificial layer that will be removed in the subsequent steps of the process and a layer made of any material protecting the substrate and capable of being selectively isotropically etched with respect to the substrate and with respect to subsequently deposited materials may be chosen, as will appear from the following description.

Figure 3B:
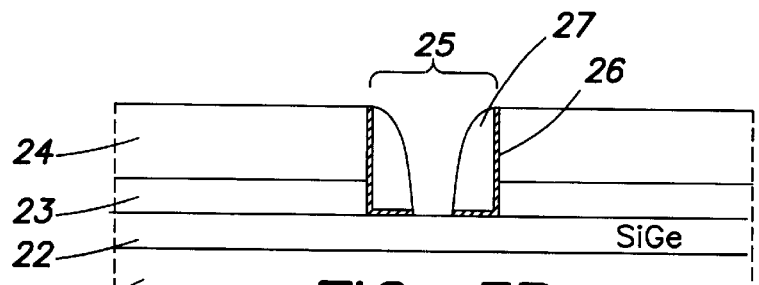

As shown in FIG. 3B, layer 23 is coated with a covering layer 24. An opening 25 is formed in covering and protective layers 24 and 23 and, at the border of the opening, a spacer, formed for example of a silicon nitride layer 26 and of a silicon oxide layer 27, is formed. Any other type of spacer may be used.

Figure 3C:
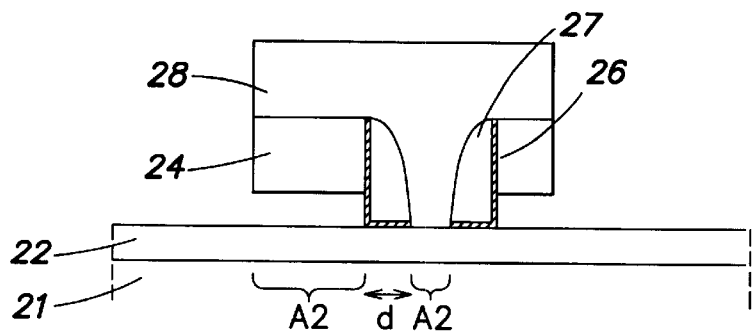

At the step illustrated in FIG. 3C, the structure has been covered with a resist layer 28 extending beyond opening 25. Layer 24 is anisotropically etched, to obtain substantially vertical sides, after which layer 23 is removed by isotropic etching. This isotropic etching is continued long enough for layer 23 to be completely removed, even in its portions disposed between layer 24 and the substrate.

Figure 1:
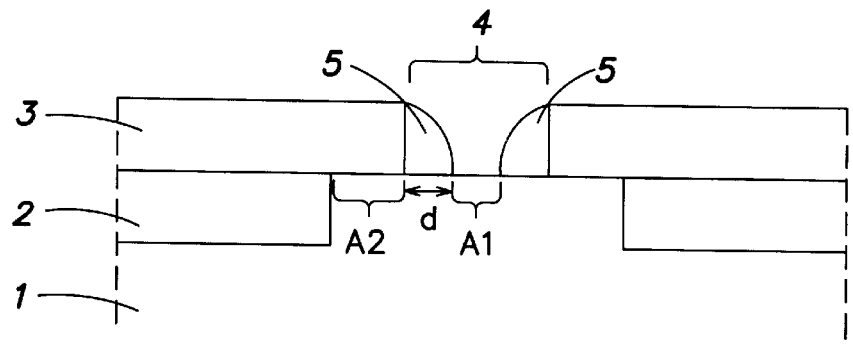
FIG. 1, previously described, illustrates a conventional spacer structure.
Figure 2:
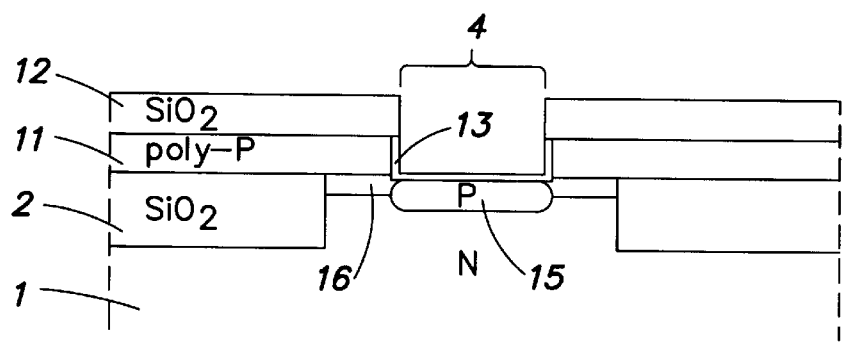
FIGS. 2A and 2B, previously described, illustrate steps of formation of the emitter-base region of an NPN transistor according to a conventional method.
Figure 3D:
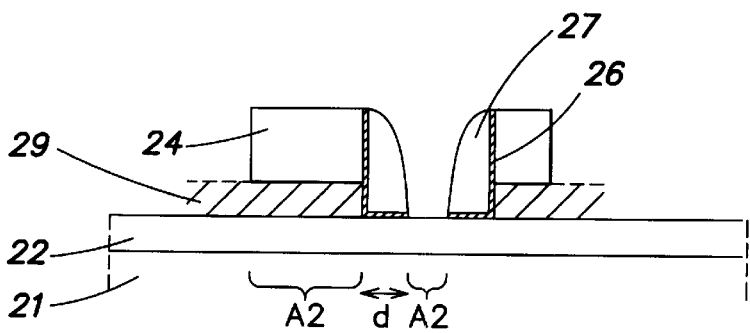

As shown in FIG. 3D, and as will be described hereafter in the context of specific example, a material 29 capable of interacting with the underlying layer to form a contact and/or a dopant source may then be deposited under layer 24, above layer 22. A first area A1 corresponding to the opening within the spacer and a second active area A2 located under layer 29 are thus obtained as in the case of FIG. 1.

Distance d between areas A1 and A2 is perfectly defined by the spacer length, independently from the fact that the mask used to delimit resist region 28 is centered or not with respect to opening 25. To properly illustrate this feature, the mask corresponding to layer 28 has been shown as being off-center in FIGS. 3C and 3D, and it can be acknowledged that this has no influence upon the obtained result.

An advantage of the present invention is that area A1 corresponding to opening 25 is protected from any interaction with material 29.

A specific application of the present invention to the forming of a self-aligned silicon-germanium base transistor structure is illustrated in relation with FIGS. 4A to 4D. In these drawings, only the emitter-base structure is shown, and in particular the buried layers and the collector contact area are not shown.

Figure 4A:
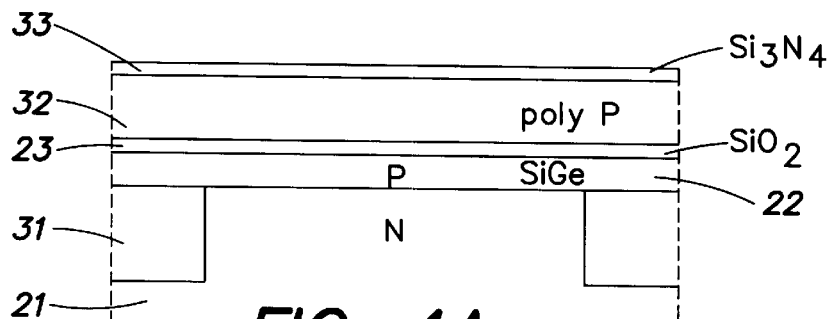
FIGS. 4A to 4D show successive steps of an example of application of the method according to the present invention.

As shown in FIG. 4A, the structure is formed from an N-type single-crystal silicon wafer 21 on which a P-type silicon-germanium layer 22 intended for form the base of a bipolar transistor has been formed by epitaxy. An active area is defined by a trench 31 filled with an insulator, for example, silicon oxide. Thus, conventionally, the silicon-germanium layer deposited by epitaxy above the structure will be a single-crystal layer above the active area defined in region 21 and a multiple-crystal layer above silicon oxide 31. SiGe layer 22 will for example have a thickness of 60 nm and a doping level between $10^{18}$ and $10^{19}$ atoms/cm$^3$.

Protective layer 23 deposited on layer 22 for example is a silicon oxide layer of a 30-nm thickness. Covering layer 24 is for example formed of a P-type doped polysilicon layer 32 of a 100-nm thickness and of a silicon nitride layer 33 of a 30-nm thickness. Polysilicon layer 32 is very heavily doped, for example between $10^{20}$ and $10^{21}$ atoms/cm$^3$.

Figure 4B:
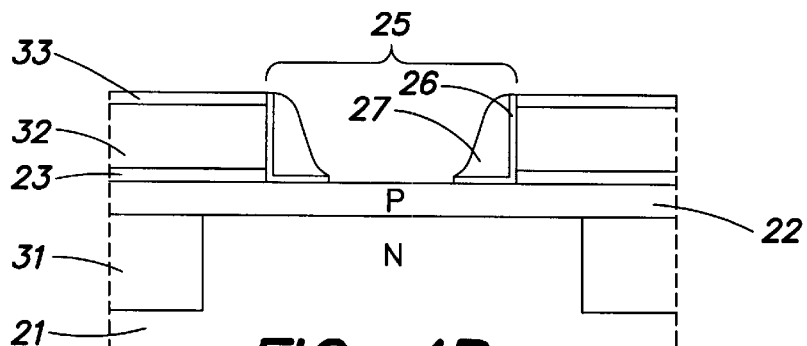

Then, as shown in FIG. 4B, an opening 25 is formed in layers 33, 32, and 23, substantially centrally with respect to the active area. A spacer is formed on the internal side of this opening, and includes for example a silicon nitride layer 26 coated with a silicon oxide layer 27.

Figure 4C:
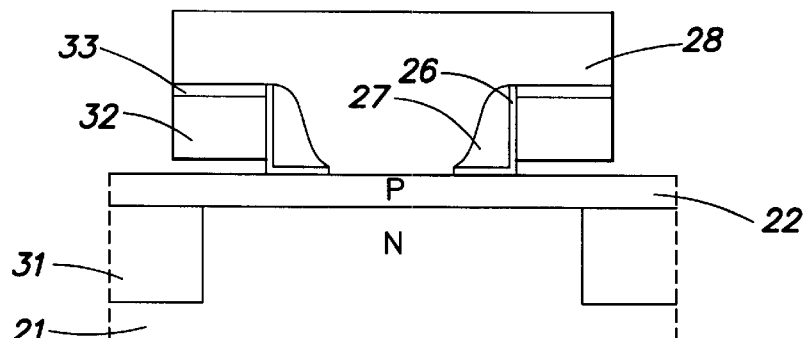

As shown in FIG. 4C, a resist layer 28, covering opening 25 and laterally extending beyond said opening on the rear side of spacer 26–27 is then deposited. Layers 33 and 32 are then anisotropically etched, after which sacrificial protective layer 23 is isotropically etched to be completely removed under layer 32.

Figure 4D:
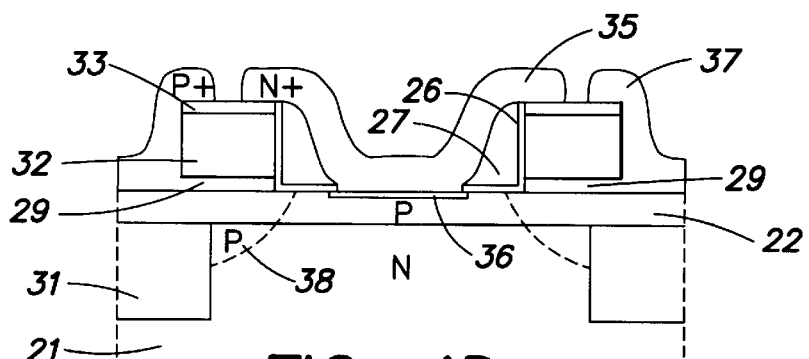

Based on the structure of FIG. 4C that is characteristic of the present invention, an NPN transistor such as shown in FIG. 4D can be formed by conformally depositing by chemical vapor deposition, an undoped polysilicon layer that completely fills up the interval between layer 22 and 32 and is designated in this location by reference 29. This layer is etched above the remaining portion of layer 33 to delimit a first central polysilicon layer portion 35 that will correspond to an emitter contact region and that will be N+-type doped to form by diffusion a shallow emitter region 36, and a second polysilicon layer portion 37 that will be P+-type doped. Upon annealing, the P-type dopant (for example boron) contained in polysilicon layer 32 diffuses through the interstitial polysilicon 29 into substrate 21 to be used as a base contact area and form an extrinsic diffused base region 38. Region 38 masks possible crystal defects generated in the area neighboring the connection between substrate 21 and oxide 31. By means of the present invention, the lateral distance between emitter 36 and extrinsic base 38 is defined in a self-aligned way without requiring the use of successive mask alignments.

Figure 5A:
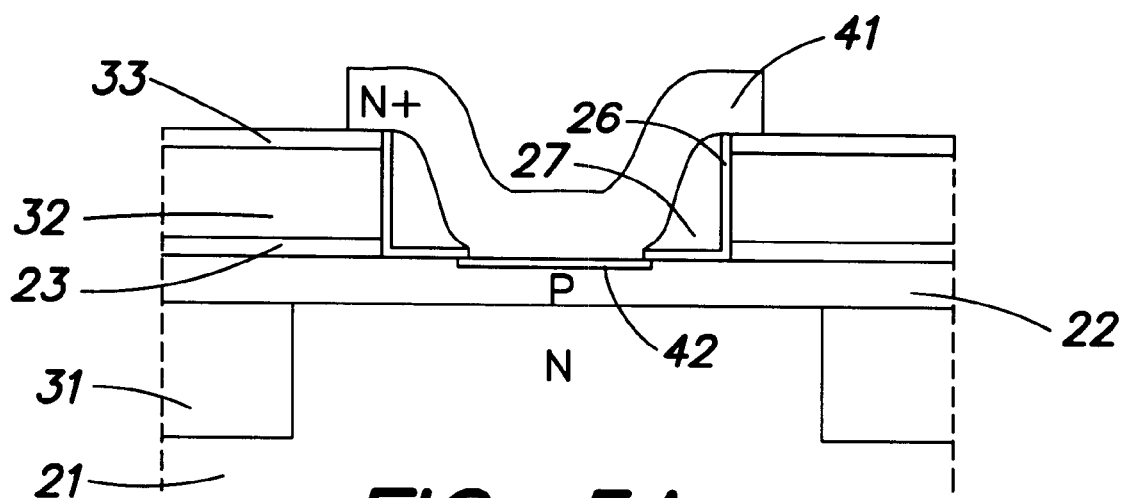
FIGS. 5A to 5B show successive steps of another example of application of the present invention.
Figure 5B:
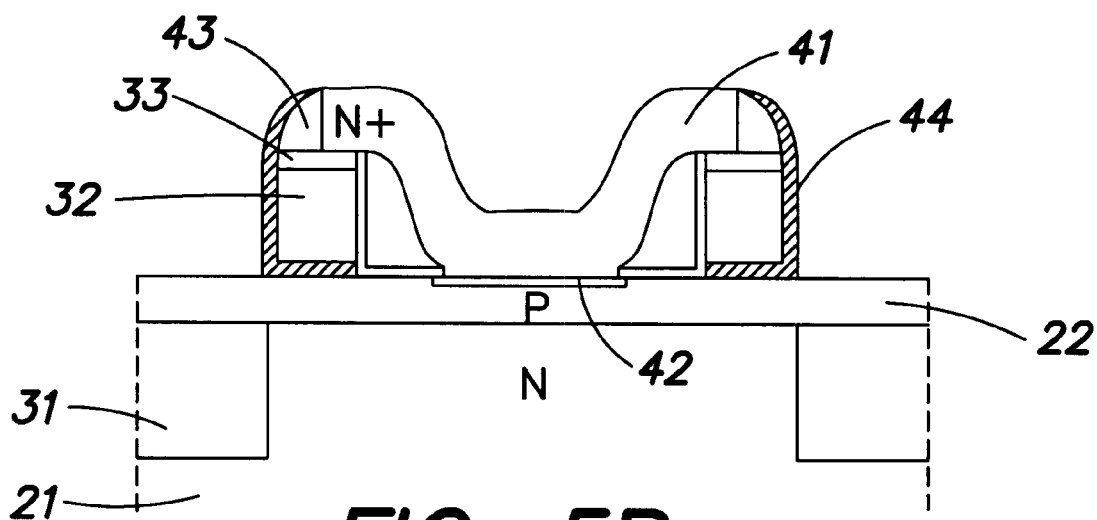

FIGS. 5A and 5B illustrate an alternative of the method described in relation with FIGS. 4A to 4D.

After the step previously described in relation with FIG. 4B, a heavily-doped N-type polysilicon layer 41 is deposited to form an emitter contacting area from which a very shallow emitter region 42 will be diffused. Layer 41 is etched laterally and lateral spacers 43, for example made of silicon oxide, are formed.

Using the mask defined by spacer 43, layers 33, 32, and 23 are then etched and layer 23 is completely removed under layer 32. After this, a polysilicon layer 44, for example doped in situ between $10^{20}$ and $10^{21}$ atoms/cm$^3$, is conformally deposited by chemical vapor deposition and anisotropically etched, so that there only remains the portion of layer 44 located under region 32 and along the lateral edges of the external window, as shown.

After the above steps, the result of which is shown in FIG. 5B, the apparent silicon surfaces may be silicided.

This method provides:
- a self-alignment between the extrinsic base and the emitter,
- a self-alignment of the silicide,
- a method using no significant annealing.

Many other alternatives of the present invention will occur to those skilled in the art. For example, during the step of FIG. 5B, instead of depositing a polysilicon layer, a tungsten layer may be conformally deposited, preferably after depositing a TiN bonding layer, these depositions being performed conformally, for example as chemical vapor depositions. After a siliciding step, the tungsten that has not reacted with the silicon is etched. In this last case, layer 32 is no longer necessarily a polysilicon layer, since it no longer has the function of a dopant source.

Of course, the present invention is likely to have various alterations, modifications, and improvements which will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for defining, on an upper surface of a substrate, two self-aligned areas, including the steps of:

depositing a protective layer;

depositing a covering layer;

opening the protective and covering layers at a location substantially corresponding to a desired border of the two areas;

forming a spacer along the edge of the opening, the spacer having a rear portion against said desired border and an opposite front portion;

opening the protective and covering layers behind the rear portion of the spacer;

removing the protective layer to reach the rear portion of the spacer; and inserting a material in the space between the substrate and the covering layer.

2. The method of claim 1, wherein the substrate comprises an upper silicon-germanium epitaxial layer.

3. The method of claim 1, wherein said material is adapted to diffusing into the substrate under the remaining portion of the covering layer.

4. The method of claim 1, wherein the substrate is a semiconductor substrate of a first conductivity type coated with a layer of the opposite conductivity type at a low doping level, wherein the protective layer is made of silicon oxide, and the covering layer is formed of the superposition of a doped polysilicon layer of a second conductivity type and of a silicon nitride layer.

5. The method of claim 1, including, after the step of removing the protective layer, the step of uniformly depositing a conductive layer by chemical vapor deposition.

6. The method of claim 4, including, after the step of removing the protective layer, the step of uniformly depositing a polysilicon layer by chemical vapor deposition.

* * * * *